United States Patent [19]

Luteran

[11] 3,739,231

[45] June 12, 1973

[54] INTERCONNECTION MATRIX BOARD

[75] Inventor: Frank K. Luteran, Jackson, Mich.

[73] Assignee: Sparton Corporation, Jackson, Mich.

[22] Filed: Nov. 26, 1971

[21] Appl. No.: 202,315

[52] U.S. Cl. .... 317/101 CE, 317/101 CC, 339/18 C
[51] Int. Cl. .... H05k 1/04
[58] Field of Search .... 317/101 CX, 101 CC; 339/18 C

[56] References Cited

UNITED STATES PATENTS

| | | | |
|---|---|---|---|
| 3,486,160 | 12/1969 | Wallace, Jr. | 317/101 CC |
| 3,078,596 | 2/1963 | Sweeton | 317/101 CC |
| 3,633,074 | 1/1972 | Nojiri | 317/101 CC |

*Primary Examiner*—David Smith, Jr.
*Attorney*—Beaman & Beaman

[57] ABSTRACT

An electrical matrix board of dielectric material having a printed circuit defined upon two surfaces thereof and including a plurality of metallic terminals defined thereon in a plurality of sets, the terminals being related such that each set includes a central terminal surrounded by secondary terminals arranged in a hexagonal configuration, and the distance between adjacent secondary terminals defining a set, and between such secondary terminals and the associated primary terminal being equal. The terminals include connection means, preferably in the form of an axial passage, a portion of which may be threaded to receive a screw connector. The terminal sets are arranged on the matrix board in groups, whereby a printed circuit interconnects the primary terminals of sets in different groups, and selected terminals of sets within the same group are also interconnected by a printed circuit. Bridge means permits interconnection of selected terminals within the same set or group and the printed circuits include taps disposed adjacent the edge of the matrix board for connecting the board into other circuitry.

11 Claims, 5 Drawing Figures

Patented June 12, 1973 3,739,231

INVENTOR

FRANK K. LUTERAN

BY Beaman & Beaman

ATTORNEY

INTERCONNECTION MATRIX BOARD

BACKGROUND OF THE INVENTION

The invention pertains to the field of electrical interconnection matrix boards wherein a variety of electrical interconnections may be accomplished by means of electrical bridges extending between terminals formed on a dielectric board having printed circuits associated therewith.

In the wiring of complex electrical circuits, such as those present in telephone mechanisms, computers, and other complex electrical devices, the wiring may be simplified by employing printed circuit matrix board devices. In highly complicated systems multiple layers of circuit boards have been employed as shown in U.S. Pat. No. 3,208,028, and more simplified control systems utilizing printed circuit boards and connectors are known as shown in U.S. Pat. Nos. 2,963,626 and 3,230,297.

In many circuits, such as used in telephone systems, it is highly desirable to be able to vary the electrical interconnections of the system in a ready manner to accommodate changes therein. However, as the apparatus is often enclosed in a concise housing, access to the usual wire conductors is limited, and many problems have been encountered in the wiring of telephone circuits under such conditions due to lack of space, the great number of wire conductors employed, and difficulty in tracing and identifying conductors. Further, it is often desired to disconnect and modify circuits, and then reestablish the same, and there is a need for an interconnection matrix board which permits a wide variety of circuits to be established with the utilization of inexpensive equipment which will produce dependable results.

SUMMARY OF THE INVENTION

It is the purpose of the invention to provide an electrical interconnection matrix board which is of a relatively simple, yet versatile, construction wherein a plurality of terminals are defined upon the board which may be readily connected to removable jumpers or bridges, and wherein the terminals are so interrelated that standard bridge means may be employed to interconnect adjacent terminals.

The terminals are mounted on the board in sets defining a hexagon, wherein six secondary terminals arranged in a hexagonal pattern constitute a set. A primary terminal for each set is located at the center thereof, and the hexagonal geometry of each set is such that the distance between adjacent secondary terminals in a set, and the distance between any of the secondary terminals to the primary terminal of the associated set is the same. Additionally, a plurality of sets are mounted upon the board to constitute a group, and the sets are so positioned that the secondary terminals of one set also constitute a portion of the secondary terminals of the adjacent set, and in this manner interconnection between adjacent sets of a common group is possible by use of a standard bridge device.

Preferably, a plurality of groups of sets are defined upon the matrix board, and the primary terminals of selected sets in different groups are interconnected by printed circuit means defined upon the board. Also, selected secondary terminals of different sets of a common group are interconnected by printed circuit means defined upon the board to further provide a versatility of interconnection with respect to secondary terminals.

The bridge means employed in the practice of the invention is preferably of a simple construction utilizing either screws or deformable fingers for cooperation with the associated terminal. In order that either type of bridge may be used the terminals each include a threaded passage wherein a screw mounted on a bridge may be received. Also, the terminals include a passage adjacent the board accessible side which is of a diameter larger than the threaded passage and includes axially extending side walls adapted to receive the deformable fingers of a bridge device.

Due to the hexagonal configuration of the sets of terminals defined upon the board, the distance between the screws mounted on a bridge, or the distance between deformable finger sets defined thereon, are standard and uniform, and thus a single bridge embodiment may be universally employed between adjacent terminals in a group.

Preferably, a dielectric film extends over the board side which is accessible to the user and this film is puncturable by the screws or fingers of the bridge members. The film will keep foreign matter from entering the terminals not in use, and also serves to insulate the nonused terminals with respect to their accessible end and the bridge members.

BRIEF DESCRIPTION OF THE DRAWINGS

The aforementioned objects and advantages of the invention will be appreciated from the following description and accompanying drawings wherein.

DESCRIPTION OF THE PREFERRED EMBODIMENT

Figure 1:
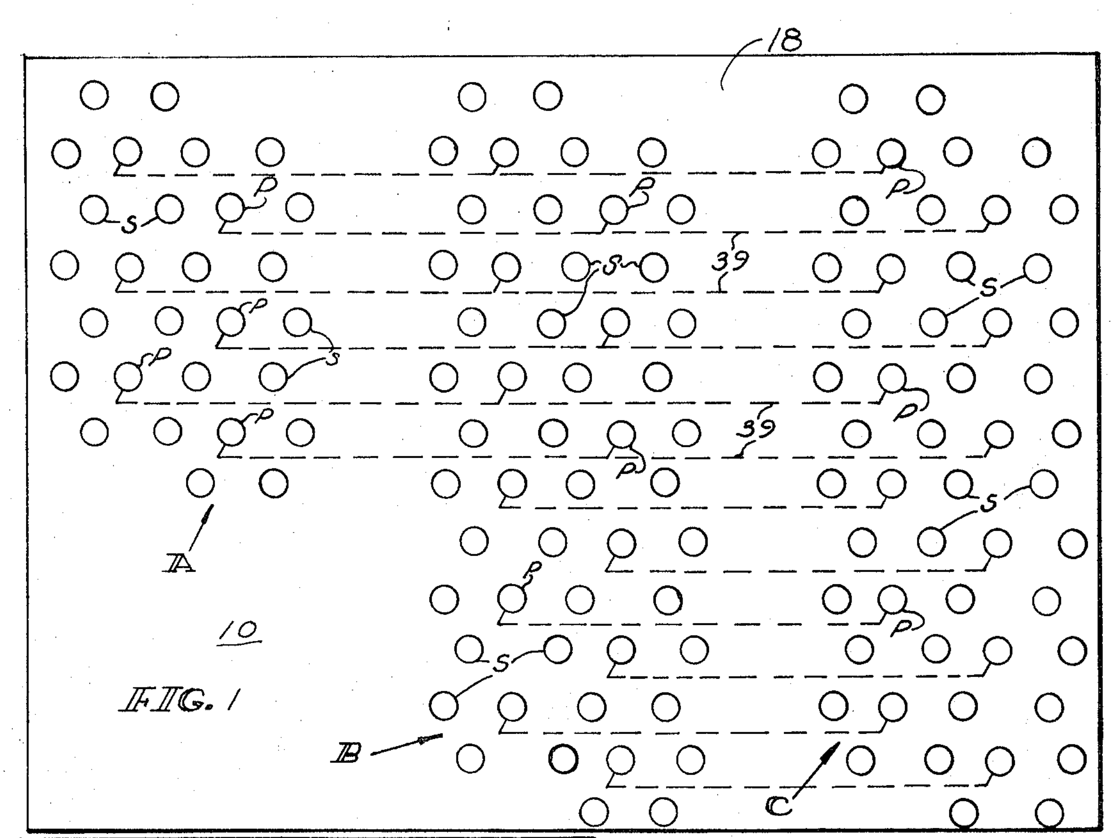
FIG. 1 is a plan view of an interconnection matrix board in accord with the invention illustrating the terminals as circles and the printed circuit interconnecting primary terminals in dotted lines.

In the illustrated embodiment a relatively simplified form of a matrix board in accord with the invention is illustrated. The illustrated form discloses a board having three groups of terminals defined thereon, and it will be appreciated that the inventive concepts may be utilized in boards of similar, but expanded, configuration.

The board 10 is formed of a dielectric material such as a fiberglass, resin, fiberboard or other synthetic material as is well known in the art. The board will normally consist of two layers, resulting from the preferred construction of the board. A layer 12 defines a first side 14 of the board, and the layer 16 defines a second side 18 of the board, the side 18 being the side accessible to the operator or installer. The layer 16 may be formed by pouring a synthetic plastic material intermediate the terminals once the terminals are installed upon the layer 12, as will be later described.

A plurality of identical metal terminals P and S are mounted upon the board 10 in sets and groups. The terminals P and S may be formed of copper, or other electrical conductive material, and include a cylindrical outer surface 20 of an enlarged diameter, a radial shoulder 22, a smaller diameter cylindrical surface 24, and deformable annular ends 26. The terminals are each provided with an axial passage which is threaded at portion 28, and is of an enlarged cylindrical configuration adjacent the terminal end 30 at 32 to define smooth axially extending side walls.

In the production of a matrix board in accord with the invention the board layer 12 is provided with holes 34 for receiving the terminal portion 24, and the terminal shoulders 22 engage the surface 36 of the layer 12 to axially locate the terminals with respect to the layer. Thereupon, the annular ends 26 of the terminals are rolled over and deformed in the manner shown in FIG. 3. Prior to formation of the holes 34 the side 14 of the layer 12 is provided with a printed circuit, actually a plurality of printed circuits extending in the vertical direction as viewed in FIG. 2, and the holes 34 intersect enlarged pad portions of the printed circuit, as at 38, FIG. 3, whereby electrical connection is made between each terminal S and the printed circuit defined on the board side 14 by the deformation of the ends 26.

Figures 2, 3, 4, 5:
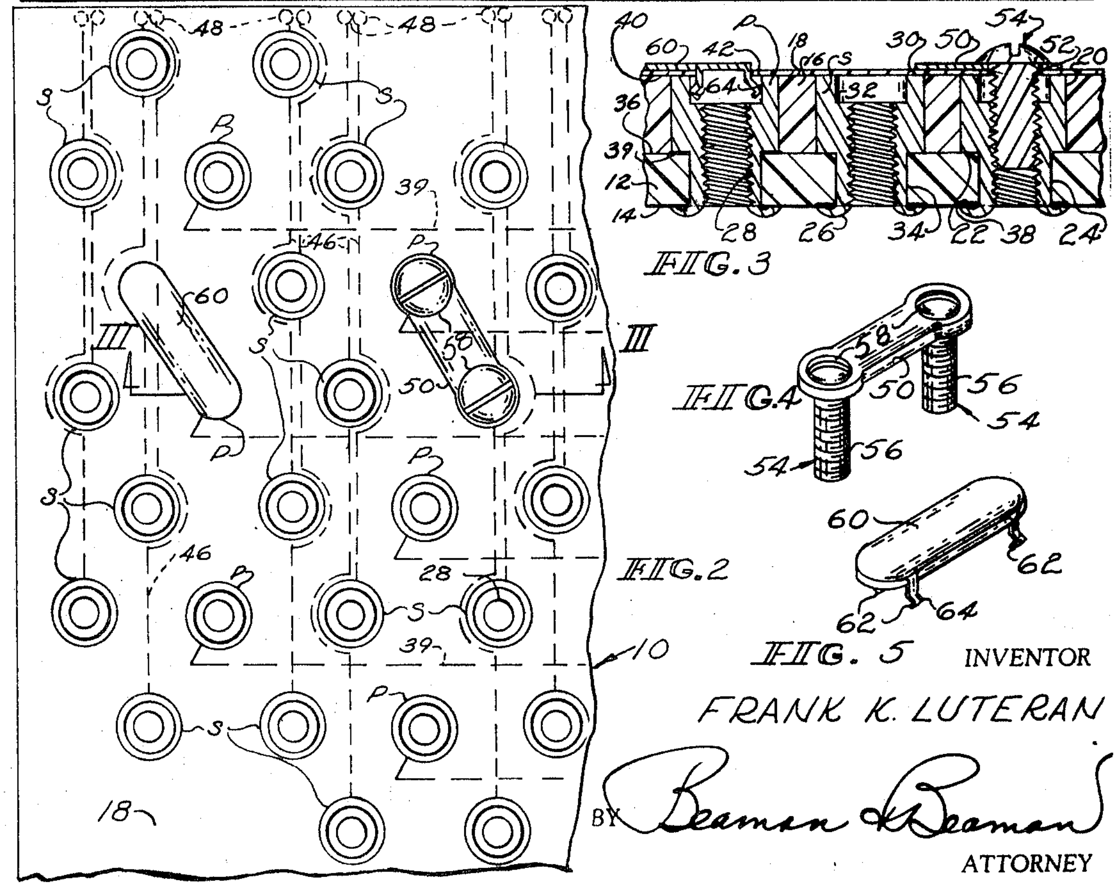
FIG. 2 is an enlarged, detail plan view of the left group of terminals of FIG. 1 in accord with the invention, two types of bridges being illustrated as used with the board, and the printed circuits defined on the board shown in dotted lines.
FIG. 3 is an elevational sectional view of the board and terminals as taken along Section III—III of FIG. 2.
FIG. 4 is a perspective view of a screw-type bridge as used in conjunction with the board of the invention.
FIG. 5 is a perspective view of a deformable finger-type bridge as used in accord with the invention.

Also, a plurality of printed circuits 39 are defined upon the surface 36 of layer 12 which extend in the horizontal direction as viewed in FIGS. 1 and 2 interconnecting the primary terminals P in horizontal alignment of different groups of terminals, and the insertion of the primary terminals into holes 34 will place the terminal shoulders 22 in electrical connection with the printed circuits 39 and the deformation of the ends 26 will maintain the electrical connection between terminals P and circuit 39. The ends 26 of the terminals P do not connect with circuit means on the layer side 14.

In order to form the layer 16, a hardenable fluid resin may be deposited upon the surface 36 to a level which corresponds to that of the terminal end surfaces 20. The resin material will fill in the voids between the terminals giving additional mechanical support to the terminals and providing a flat surface 40 which is flush or coplanar with the terminal end surfaces 30.

A dielectric film 42 covers the board surface 40 passing over the passages defined in the terminals, and adhering to the board material of layer 16 intermediate the terminals, and the terminal ends 30. The film 42 is formed of a synthetic plastic material and is readily puncturable as it passes over terminal bores 32 when engaged by a relatively sharp rigid member.

With reference to FIGS. 1 and 2, the terminals P and S are indicated as being arranged in three separate groups designated A, B and C. Groups B and C contain twice as many terminals as group A, and in the practice of the invention, if the board 10 were of a larger dimension, additional groups can be added to the right, FIG. 1, whereby the additional groups may contain a number of terminals which are a multiple of those of the adjacent group to the left.

The terminals of each group are arranged in a plurality of sets, each set consisting of six secondary terminals S defining a hexagon, having a primary terminal P centrally located with respect to the secondary terminals S disposed thereabout. The distance between adjacent terminals in a set is equal, and the distance between each secondary terminal and the primary terminal of the same set is also equal to the distance separating secondary terminals of the same set. Further, as will be appreciated from FIGS. 1 and 2, secondary terminals S of one set are also common to an adjacent set. For instance, two of the terminals S of each set constitute two terminals S of adjacent sets, and the primary terminals of each set are disposed such that the aforementioned terminal positioning is possible. As many as five terminals S of a set may be shared with adjacent sets.

With reference to FIG. 2, dotted lines 46 indicate the locations and associations of printed circuits defined upon the board side 14 in electrical connection with the deformed ends 26 of the indicated secondary terminals S at circuit pad portions 38. The printed circuits 46 extend in a vertical direction terminating in tap points 48 adjacent the edge of the board 10 on the side 14, such tap points may be in the form of solder pad connections, or the like, as may be employed with printed circuit board devices wherein conductors of a wire type are to be connected to the printed circuit. As will be appreciated from FIG. 2, the sequence of interconnection of the secondary terminals S with each other provides a wide possibility of possible interconnections with other terminals P and S, in that each terminal in a group, except those terminals defining the periphery of the group, may be connected to one of six other terminals by means of the bridge devices later described. The taps 48 associated with each group are oriented with the associated group in such a manner as to be readily identified, and the taps may be coded by number or color, if desired.

Interconnection of adjacent terminals of a common group is accomplished by electrical conductor bridge means adapted to mechanically associate with two terminals. Embodiments of two bridge interconnectors are shown in FIGS. 4 and 5.

With reference to FIG. 4, the bridge includes an elongated body 50 of a strip of sheet metal material having enlarged ends through which holes 52, FIG. 3, are defined. A screw 54 is rotatably received in the hole 52 defined in each end region of the body 50, and the screw includes a threaded shank portion 56, and a head 58 having a screw driver receiving slot defined therein. The distance between the centers of the screws 54 on the body is identical to the distance separating the centers of adjacent terminals P and S on the matrix board 10, and thus the connector bridge body 50 may be used to electrically interconnect any two adjacent terminals of a common group by threading the screw shanks 56 into the terminal threaded passages 28, as apparent in FIG. 3. To accomplish such insertion of the screw into the terminal passage the film 42 extending over the terminal passage desired to be connected is broken, either by the screw itself, or a sharp pointed instrument, and the screw is threaded into the terminal to the full extent shown in FIG. 3. Thus, the body member 50 will be maintained directly adjacent the film 42, and the bridge will conform to the planar shape of the matrix board surface 18.

The embodiment of bridge connector shown in FIG. 5 consists of an elongated sheet metal body 60 having a pair of spaced deformable fingers 62 defined adjacent each end region of the body, and extending from a common side thereof. The spacing of the fingers 62 is such that the outwardly deformed knuckle portions 64 of the fingers mechanically frictionally engage the terminal side walls of enlarged passage portion 32 in a manner clearly shown in FIG. 3. The spacing between the fingers 62 is such that insertion into the terminal portion 32 slightly compresses the fingers to insure an effective mechanical and electrical interconnection with the terminal. Of course, prior to inserting the fingers 62 into terminal passage 32, the film 42 extending over the passage must be broken, and the film may be readily penetrated by the bridge fingers. Thus, it will be appreciated that the bridge body 60 may be installed between a pair of adjacent terminals by a "snap in" action, and may be removed from the terminals by prying the same away from the board side 18.

In use, such as in telephone circuit work, the matrix board 10 would be wired into the main circuit by means of the tap pads 48. The side 18 of the board is installed as to be readily accessible to the service man who, by the installation or removal of bridges as shown in FIG. 4 and 5, is able to readily interconnect such circuits as desired very quickly and in a positive electrical conducting relationship. By interconnecting the primary terminals of various groups of terminals and the possibilities of circuit combinations is very great, and by utilizing a greater number of sets in a group, such as in groups B and C, a wide variety of circuit combinations may be readily achieved by the service man with a minimum of time and effort, and the fact that the matrix board eliminates the service man handling loose wires reduces the likelihood of mistakes.

A matrix board in accord with the invention may be economically manufactured, and readily installed in existing equipment. The fact that the bridge connectors are disposed adjacent the side 18 of the matrix board minimizes space requirements of the board, and discourages tampering with the bridges due to their close proximity to the board side. The presence of the film 42 keeps the terminal passages clean until used and the film also serves to insulate the terminal ends 30 of terminals not in use.

It is appreciated that various modifications to the inventive concept may be apparent to those skilled in the art, and it is intended that the inventive concept include such embodiments as may fall within the scope of the invention.

I claim:

1. An interconnection matrix board comprising, in combination, an electrically insulated board having first and second sides, a plurality of electrical conductor terminals mounted on said board each having conductor connection means defined thereon, said terminals being arranged on said board in a plurality of sets wherein each set includes a central primary terminal surrounded by six secondary terminals, said secondary terminals of a set being spaced relative to each other to define a hexagon wherein the distance between adjacent secondary terminals and the distance between said primary terminal and its associated secondary terminals is equal, first printed circuit means defined on said board interconnecting selected primary terminals, and second printed circuit means defined on said board interconnecting selected secondary terminals.

2. An interconnection matrix board as in claim 1 wherein said sets of terminals are arranged on said board in at least two groups, selected primary terminals of separate groups being interconnected by said first printed circuit means, selected secondary terminals of adjacent terminal sets of a common group being common to two terminal sets, said second printed circuit means interconnecting selected secondary terminals of a common group.

3. An interconnection matrix board as in claim 1, a removable electrical connector bridge interposed between and interconnecting two terminals, said bridge having means cooperating with said terminal conductor connection means separated from each on said bridge by a distance equal to that of the spacing between adjacent terminals.

4. An interconnection matrix board as in claim 1 wherein said terminals each include first and second ends, said secondary terminals' first ends being disposed adjacent said board first side and in electrical contact with said second printed circuit means defined on said board first side, said terminals' second ends being flat and coplanar with said board second side and the conductor connection means of said terminals being accessible from said board second side.

5. An interconnection matrix board as in claim 4 wherein said terminal conductor connection means comprises an axial passage defined in said terminals accessible from said terminal second end, said passage including a first threaded portion axially spaced from said terminals' second end and a second portion adjacent said terminals' second end of a diameter larger than said first passage portion and defined by cylindrical side walls.

6. An interconnection matrix board as in claim 5, an electrical conducting bridge interconnecting two adjacent terminals, said bridge comprising an elongated conductor body, a pair of screw members rotatably mounted on said conductor body spaced apart a distance equal to the distance separating the passages of adjacent terminals, said screw members being threaded into the threaded passages of the associated terminals affixing said bridge conductor body thereto in electrical conducting relationship therewith.

7. An interconnection matrix board as in claim 5, an electrical conducting bridge interconnecting two adjacent terminals, said bridge comprising an elongated body of electrical conducting material, a pair of sets of deformable fingers defined on said bridge body, said sets being spaced from each other on said bridge body a distance corresponding to the distance separating adjacent terminals, the fingers of each set being received within the passage second portion of the associated terminal and frictionally engaging the side walls thereof to establish electrical interconnection between the associated terminals.

8. An interconnection matrix board as in claim 2 wherein said board comprises first and second interconnected superimposed layers of dielectric material, said first layer defining said first board side and including an intermediate surface disposed between said layers, said terminals extending through both board layers and one of said printed circuit means defined on said first board side and the other of said printed circuit means defined on said intermediate surface.

9. An interconnection matrix board comprising, in combination, an electrically insulated board having first and second sides, printed circuit means defined on said first side, a plurality of electrical conductor terminals mounted within said board extending between said sides, selected terminals having a first end in electrical conducting relationship with said printed circuit means and all of said terminals' second ends being substantially aligned with said board second side, a conductor receiving passage defined in each of said terminals accessible from said board second side, a puncturable dielectric film disposed over said board second side and all of said terminals' second ends, said terminals being arranged on said board in a plurality of sets wherein each set includes a central primary terminal surrounded by six secondary terminals, said secondary terminals of a set defining a hexagon wherein the distance between adjacent secondary terminals and the distance between said primary terminal and its associated secondary terminals is equal, selected secondary terminals of adjacent sets being common to more than one terminal set.

10. In an interconnection matrix board as in claim 9 wherein said sets of terminals are arranged on said board in at least two groups, selected primary terminals of separate groups being interconnected by a primary terminal printed circuit defined on said board, selected secondary terminals of adjacent terminal sets of a common group being interconnected by said printed circuit defined on said first side, and tap means defined on said board constituting a portion of said printed circuit defined on said first side.

11. An interconnection matrix board as in claim 9 wherein said board comprises first and second interconnected superimposed layers of dielectric material, said first layer defining said first board side and including an intermediate surface disposed between said layers, said terminals extending through both board layers, said primary terminal printed circuit being defined on said intermediate surface, and said second layer defining said board second side.

* * * * *